US011363686B2

(12) United States Patent
Tarasov

(10) Patent No.: US 11,363,686 B2
(45) Date of Patent: Jun. 14, 2022

(54) MICROWAVE OSCILLATOR AND MATRIX-TYPE MICROWAVE OSCILLATOR BASED THEREON

(71) Applicant: MW MATRIX INC., North Miami Beach, FL (US)

(72) Inventor: Mark Tarasov, Denisovy (RU)

(73) Assignee: MW MATRIX INC., North Miami Beach, FL (US)

( * ) Notice: Subject to any disclaimer, the term of this patent is extended or adjusted under 35 U.S.C. 154(b) by 532 days.

(21) Appl. No.: 16/290,144

(22) Filed: Mar. 1, 2019

(65) Prior Publication Data

US 2020/0281052 A1 Sep. 3, 2020

(51) Int. Cl.
*H05B 6/80* (2006.01)
*H05B 6/70* (2006.01)
*H05B 6/64* (2006.01)
*H03B 9/10* (2006.01)

(52) U.S. Cl.
CPC .............. *H05B 6/80* (2013.01); *H03B 9/10* (2013.01); *H05B 6/6402* (2013.01); *H05B 2206/044* (2013.01)

(58) Field of Classification Search
CPC . B66B 11/0025; B66B 11/0075; B66B 11/06; B66B 5/24; B66B 7/026; B66B 7/064; B66B 7/08; H03B 11/02; H03B 5/1817; H03B 9/10; H05B 2206/044; H05B 6/6402; H05B 6/80

USPC ....... 219/678, 690, 695, 693, 696, 698, 697, 219/750, 756, 761, 762
See application file for complete search history.

(56) References Cited

U.S. PATENT DOCUMENTS

2003/0106891 A1* 6/2003 Fagrell ................... B01J 19/126
219/695
2008/0099447 A1* 5/2008 Ando ................ H01J 37/32192
219/121.43

FOREIGN PATENT DOCUMENTS

RU 2394357 A 4/2010

* cited by examiner

*Primary Examiner* — Quang T Van
(74) *Attorney, Agent, or Firm* — Cantor Colburn LLP

(57) ABSTRACT

The invention relates to the field of microwave emitting equipment, in particular to microwave oscillators. The proposed variants of an oscillator and a matrix-type microwave oscillator enable to efficiently direct microwave radiation from one or more microwave sources and sum up microwave radiations, thus ensuring high values of efficiency and output power, superior functional capabilities of the device, a high degree of synchronization of radiations emitted by said microwave sources. The microwave oscillator comprises a microwave source and a resonator with a microwave channel made therein. The resonator comprises a box and a base electrically connected to each other, while the microwave channel accommodates a suppressing means for suppressing a back wave. The matrix-type oscillator comprises a plurality of said microwave oscillators electrically connected to each other.

14 Claims, 13 Drawing Sheets

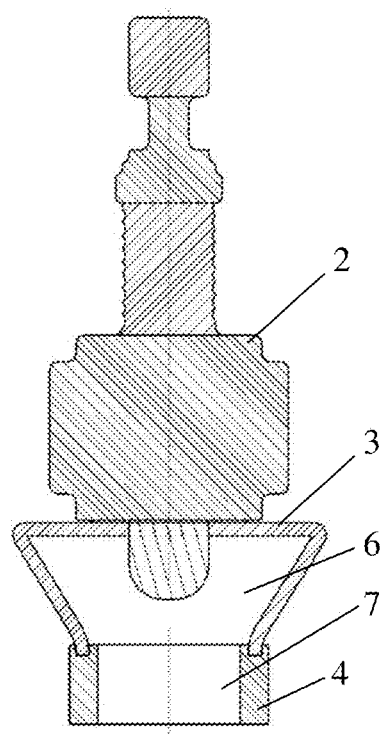
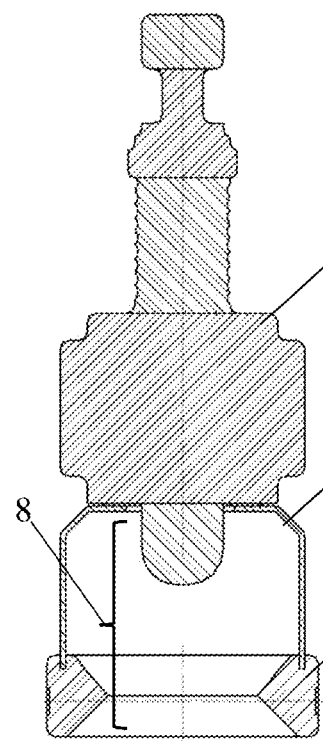
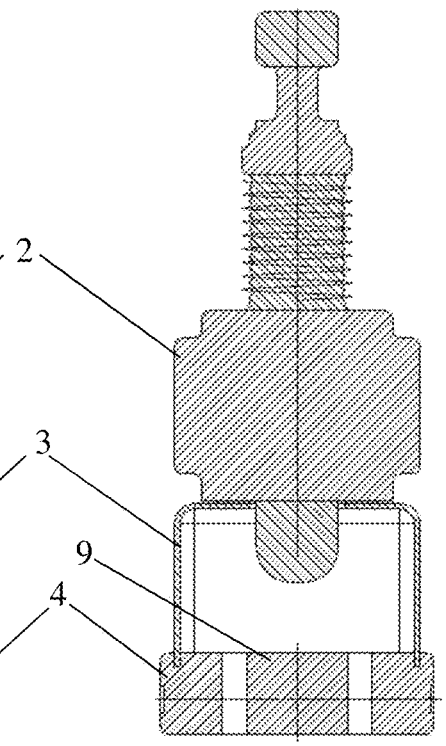
Fig. 2a     Fig. 2b     Fig. 2c
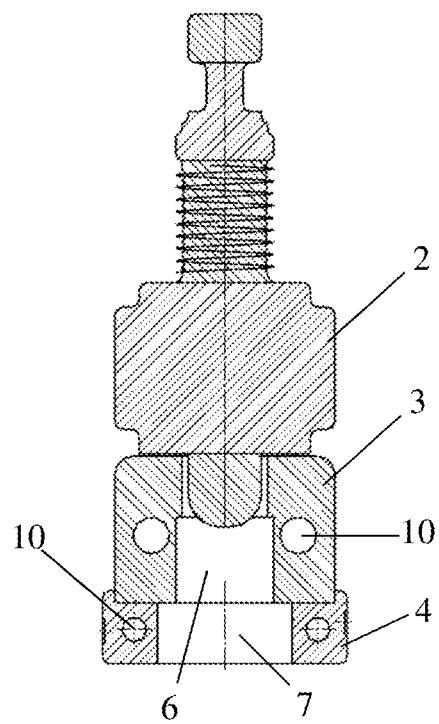
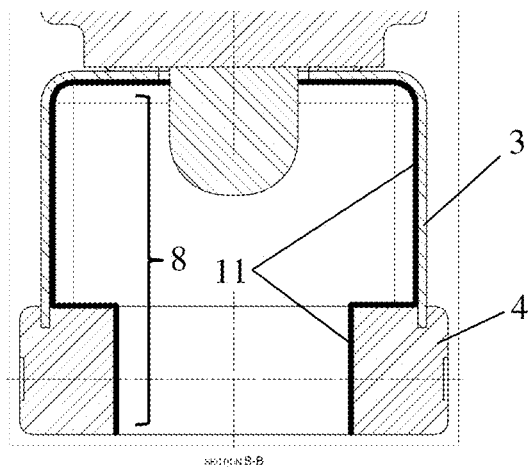
Fig. 2d     Fig. 2e

MICROWAVE OSCILLATOR AND MATRIX-TYPE MICROWAVE OSCILLATOR BASED THEREON

FIELD OF THE INVENTION

The invention relates to the field of microwave frequency equipment, in particular to microwave radiation oscillators, or microwave oscillators.

PRIOR ART

A high cost of powerful microwave radiation sources significantly hampers the development of prospective microwave technologies and their industrial-scale implementation. At the same time, production of medium-power microwave radiation sources, or microwave sources, is developed globally, such as magnetrons for consumer microwave ovens, wherein a cost of power unit is significantly lower than that of high-power microwave sources. Therefore, efficient summation of microwave radiation emitted by a plurality of medium-power microwave sources is an actual task from the point of reducing a cost of devices for generation of cumulative powerful microwave radiation, reducing their weight and dimensions, finding solutions for heat removal. However, summation of radiation emitted by a plurality of microwave sources for the purpose of increasing a total power of microwave radiation may face serious problems due to complexity of complying with the requirements of mutual synchronization of microwave sources without a significant reduction of a total efficiency of such a device when such sources are operated jointly.

The closest analog of this invention is a microwave oscillator being a device for summing up power of several microwave sources, namely magnetrons, which is disclosed in RU2394357 (published on 10 Jul. 2010, IPC H03B9/10). The known device comprises the resonator in the form of a piece of rectangular waveguide short-circuited on the edges thereof and having the magnetrons installed thereon. The magnetrons are located close to each other on the wide wall of the resonator so that energy outputs of the magnetrons enter the resonator through the middle of the wide wall. The short-circuiting selective inserts are symmetrically installed between the energy outputs of the magnetrons inside the resonator. The radiating slots for output of energy to a surrounding space are located in the other wide wall of the resonator, opposite to each magnetron. The size of the resonator wide wall is equal to the half wavelength corresponding to the operating frequency of the magnetrons. This device known in the art allows summation of power of a plurality of magnetrons having a pre-determined power each for the purpose of producing a higher total power of microwave radiation in the mode of mutual synchronization and coherent radiation.

In essence, the device described in RU2394357 is a matrix-type microwave oscillator, i.e. a device combining several microwave sources (magnetrons).

Summation of microwave radiations emitted by several microwave sources occurs when said microwave radiations are synchronized, for which purpose such microwave sources should be arranged in a space in such a way that oscillations of generated microwave waves are summed up in phase with due regard to counter-phase excitation of the neighboring microwave sources.

Generally, the condition for synchronizing radiations emitted by several microwave sources is the following:

$|\sin \varphi| < 1/(n-1)$, where $\varphi$ is the instantaneous phase difference between oscillations of a microwave source and a synchronizing signal; n is the number of the microwave sources. However, said condition does not take into account a method of coupling between the microwave sources.

Usually, in order to synchronize operation of several microwave sources a stabilizing resonator is used which is an elongated rectangular waveguide short-circuited on both ends thereof, as described in the above mentioned RU2394357. In such the stabilizing resonator, one of waves H (101-104) formed at a resonance may be considered as the main type of oscillations. In order to select oscillations of this type, short-circuiting selective inserts in the form of poles are installed at an equal interval in the resonator between wide walls thereof.

In the closest analog, even when just four magnetrons are arranged in a row and their microwave radiation frequencies are close to each other, it is rather difficult to achieve a high degree of synchronization of microwave radiations emitted by the magnetrons and, consequently, a high value of the device efficiency, which clearly follows from Table 1 of RU2394357. However, a greater shortcoming of this analog is impossibility to practically achieve acceptable values of the device efficiency when several such linear oscillators of microwave radiation are arranged in parallel to each other, i.e. next to each other (but not one after other), thus forming a two-dimensional matrix of magnetrons. This fact puts a restriction on a number of microwave sources that may be arranged on a small area and, consequently, limits a total power of microwave radiation emitted by this known device for summing up microwave radiations.

SUMMARY OF THE INVENTION

The objective of this invention is to provide a microwave oscillator capable of combining a plurality of microwave sources not only in a row, but also in a two-dimensional matrix, while ensuring a high efficiency value and a high microwave radiation power.

The technical effects of the invention are expanded functional capabilities of a microwave oscillator, a high degree of synchronization of radiation emitted by several microwave oscillators, higher efficiency and increased capacity of the device.

According to the first aspect of the invention, a microwave oscillator comprises a microwave source and a resonator. A microwave channel is formed in the resonator for the purpose of directing radiation from the microwave source. The resonator comprises a box on which the microwave source is installed and wherein a first channel is formed, and a base with a second channel formed therein. The box and the base are electrically connected to each other. The second channel is an extension of the first channel, and thus said first and second channels form the microwave channel. The microwave channel may accommodate a suppressing means for suppressing a back wave. The microwave channel may be made substantially straight, i.e. without sufficient bends typical for the devices known in the art.

In the microwave oscillator, the resonator consists of two elements, namely the box and the base, and the microwave channel passing therethrough. Microwave radiation emitted by the microwave source passes along the microwave channel through the first channel formed in the box and serving for pre-guiding that microwave radiation. Then, the microwave radiation is finally formed when that microwave radiation passes through the second channel.

Since the box and the base are electrically connected to each other, currents arising when microwave radiation passes through the microwave channel influence the microwave radiation during its passing through the first channel and the second channel.

Moreover, the suppressing means may also influence the microwave radiation. On one hand, said suppressing means enables the microwave radiation to go out of the microwave oscillator without significant losses, provided a form, a size and a position of the suppressing means are correctly selected. On the other hand, the suppressing means does not enable the microwave radiation, when it is reflected from external objects (e.g., objects that are heated by radiation emitted by the microwave oscillator), to return to the microwave channel back causing significant reduction of the total output capacity of the microwave oscillator, heating of the microwave oscillator and other undesirable effects well-known to those skilled in the art.

As a result, high-power radiation is formed at an outlet of the second channel, i.e. the outlet of the microwave channel, and the microwave oscillator is characterized by high efficiency and narrow spatial distribution of microwave radiation in two-dimensional and three-dimensional space.

A flare (waveguide) may be used in the microwave oscillator, which may be arranged on a side of the base that is opposite to another side thereof contacting the box. The flare enables to focus outgoing microwave radiation with minimum losses, while maintaining efficiency and output power of microwave radiation.

In order to ensure better heat removal, the microwave source may be installed at a distance from the box. In such a case, the microwave source is preferably installed on the box via a waveguide for minimizing radiation losses and ensuring uniform distribution of a field.

In order to efficiently transfer microwave radiation emitted by the microwave source and, consequently, to raise efficiency of the microwave oscillator, the microwave channels may have a variable cross section.

The surface of the microwave channel may be coated with a layer of an electrically conducting material. It may be achieved by various methods, such as by making the box and the base of an electrically conducting material; or by applying electrically conducting coatings (similar or differing by their characteristics, such as thickness, conductivity, thermomechanical behavior, etc.) onto surfaces of the first channel and the second channel in the form of a film, foil and the like; or by installing electrically conducting shields on said surfaces of the channels; or by any other method known to those skilled in the art.

The box and the base may be made either as individual parts or a single part. Making of the box and the base as individual parts, i.e. making a compound resonator, enables to select such a form of the box and the base that ensures required efficiency of the device and good heat removal. If the box and the base are made as a single part, i.e. the resonator is made integral, this will increase efficiency and output power of the microwave oscillator.

The microwave oscillator may also comprise at least one cooling channel intended for cooling the device. This enables to maintain operation stability of the microwave oscillator.

According to the second aspect of the invention, a matrix-type microwave oscillator is proposed that comprises at least two above-described microwave oscillators which resonators are electrically connected to each other.

As already said, the problem relating to efficient synchronization of radiations emitted by a plurality of microwave sources included into the microwave device is a direct reason of relatively low efficiency of conventional devices known in the art. Furthermore, such conventional devices require usage of microwave sources having similar or rather close frequencies of radiation and a radiation power.

Owing to the fact that in the present invention the resonators of the microwave oscillators are electrically connected to each other, currents arising when microwave radiation passes through all the microwave channels of the matrix-type oscillator interact and, consequently, influence microwave radiation in the microwave channels. This ensures a high degree of synchronization of microwave radiation emitted by all the microwave sources included into such the matrix-type oscillator and, consequently, high efficiency thereof.

Even a higher degree of synchronization of radiation emitted by several microwave sources may be achieved if the matrix-type oscillator further comprises synchronizing channels formed between the microwave oscillators and connecting the neighboring microwave channels. Alternatively, the matrix-type oscillator may comprise synchronizing inserts located in the bases and/or the boxes between the neighboring microwave channels; said inserts may be similar to those used in the device of RU2394357.

It is preferable that the matrix-type oscillator comprises a common flare (waveguide) installed on the bases, which enables to focus outgoing microwave radiation more efficiently and without losing radiation power.

Various implementations of the boxes and the bases of the microwave oscillators included into the matrix-type oscillator are possible. This, in the matrix-type oscillator, at least some bases of the microwave oscillators, or at least some boxes of the microwave oscillators, or at least some resonators of the microwave oscillators may be made as a single part.

The above-said degree of synchronization directly influences efficiency of the matrix-type oscillator and may be determined by comparing a quantity of electric energy supplied to the matrix-type oscillator (i.e. to all the microwave sources included into the matrix-type oscillator) with a quantity of effective work produced by the matrix-type oscillator. In order to determine such the quantity of effective work produced, one may measure, for example, to what extent a temperature of a substance heated by the matrix-type oscillator will rise. The more the temperature rise, the higher the degree of synchronization is and, accordingly, the higher the efficiency of the matrix-type oscillator is.

BRIEF DESCRIPTION OF THE DRAWINGS

Below, the claimed microwave oscillators will be discussed in more detail with reference to the accompanying drawings showing some possible embodiments of the invention, wherein:

FIG. 2a shows a cross-sectional view of an embodiment of the microwave oscillator with a first channel of a variable cross section and a second channel of a constant cross section;

FIG. 2b shows a cross-sectional view of another embodiment of the microwave oscillator with a second channel of a variable cross section;

FIG. 2c shows a cross-sectional view of yet another embodiment of the microwave oscillator with a suppressing means for suppressing a back wave;

FIG. 2d shows a cross-sectional view of still another embodiment of the microwave oscillator with cooling channels;

FIG. 2e shows an enlarged cross-sectional view of a portion of an embodiment of the microwave oscillator having an electrically conductive layer on surfaces of a first channel and a second channel;

BEST MODES OF CARRYING OUT THE INVENTION

Figure 1A:
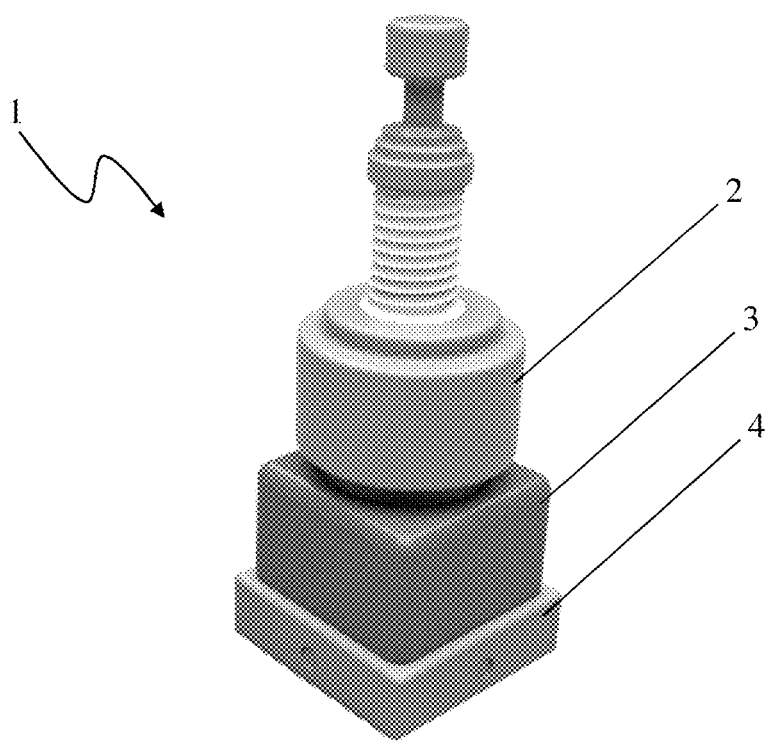
FIG. 1a shows a general view of an embodiment of the microwave oscillator.
Figure 1B:
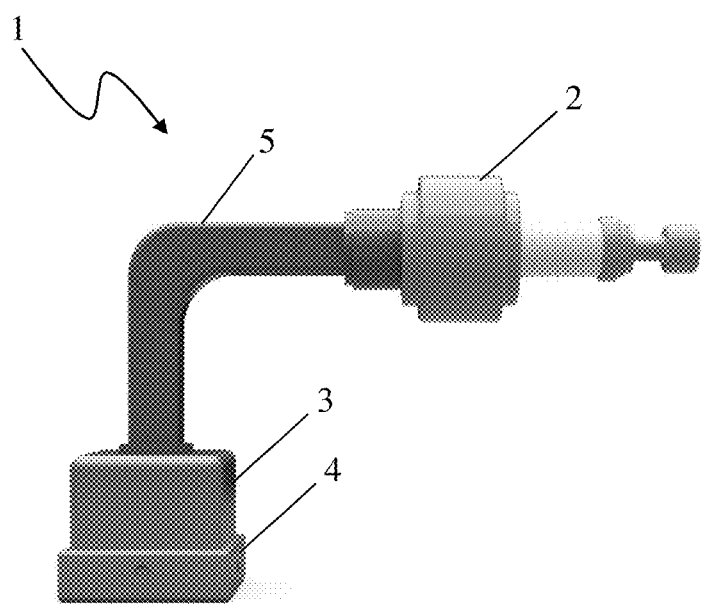
FIG. 1b shows a general view of another embodiment of the microwave oscillator with a waveguide.

In a general case, a microwave oscillator 1 comprises a microwave source 2 installed on a box 3, and a base 4 adjoining the box 3. The source 2 may be installed either directly on the box 3 (FIG. 1a) or via a waveguide 5 connecting the source 2 and the box 3 (FIG. 1b).

The box 3 and the base 4 form a resonator of the oscillator 1. The resonator may be made as a single part or as the box 3 and the base 4 being separated and electrically connected to each other.

FIGS. 2a-2e show cross-sectional views disclosing the interior arrangement of the oscillator 1.

In the box 3, a first channel 6 is formed via which microwave radiation emitted by the source 2 passes to the base 4. The box 3 may be hollow, and then the first channel 6 may be an inner cavity of the box 3 (FIGS. 2a-2c). Alternatively, the box 3 may be massive, i.e. solid (FIG. 2d), and then the first channel 6 will be a through channel going through the box 3. The first channel 6 may have a constant cross section, as shown in FIGS. 2b, 2c, 2d, or a variable cross section, e.g. in the form of a narrowing or expanding conical through channel, as shown in FIG. 2a. Other shapes of the first channel 6 are also possible.

In the base 4, a second channel 7 is formed via which microwave radiation coming from the first channel 6 passes through the base 4. In such a way, the first channel 6 and the second channel 7 together form a microwave channel 8 which extends through the resonator. Microwave radiation emitted by the source 2 passes through and goes out of the oscillator 1 via an outlet of the microwave channel 8.

Preferably, the base 4 is made massive, i.e. solid (FIGS. 2b, 2c, 2d), though it may be made hollow (FIG. 2a). Similarly to the first channel 6, the second channel 7 may be an inner cavity of the base 4 (FIG. 2a) or a through channel going through the base 4 (FIGS. 2b, 2c, 2d). The second channel 7 may have a constant cross section as shown in FIGS. 2a, 2c, 2d, or a variable cross section as shown e.g. in FIG. 2b. Various shapes of cross sections of the first channel 6 and the second channel 7 are allowed, which are selected depending on the source 2 used, specific application conditions of the oscillator 1, required efficiency, etc. It is preferable, however, that the second channel 7 is made expanding from the first channel 6 to the outlet of the microwave channel 8.

The oscillator 1 further comprises a suppressing means 9 for suppressing a back wave, which is, at least partially, located in the microwave channel 8, e.g., in the second channel 7, as shown in FIG. 2c. The suppressing means 9 is intended for suppressing a microwave reflected by an external object (a surface thereof) when it is irradiated by radiation emitted by the oscillator 1.

Entering of a reflected microwave back into the oscillator 1 causes a number of undesirable effects. First, the reflected microwave causes additional heating of the base 4 and the box 5, and then it is necessary to take measures in order to cool the oscillator 1. Second, it causes reduction in the total output power of the oscillator 1. Third, penetration of the reflected microwave back through the microwave channel 8 along the first channel 6 up to the source 2 leads to an increased load on the source 2 and failure thereof.

As the inventors found, the above listed undesirable effects may be reduced by using the suppressing means 9 that should be arranged, at least partially, in the microwave channel 8. Apart other advantages, this allows, in the preferred mode of the invention, to making the microwave channel 8 substantially straight and relatively short, whereas the devices known in the art require lengthy and bended (i.e. made of several portions positioned perpendicularly to each other) channels to reject a back wave that, however, significantly reduces efficiency and total output power of such known devices.

Preferably, the suppressing means 9 is arranged, at least partially, in the second channel 7, as shown in FIG. 2c. In such a case, the reflected microwave is suppressed at the outlet of the oscillator 1 and, practically, does not enter into the second channel 7. A shape (e.g., elongated, cylindrical, conical, spherical), a method of attaching (e.g., by means of one or more bridges, brackets, suspensions, making integral with the microwave channel 8), physical parameters (e.g., a material used, its conductance) for the suppressing means 9 should be selected in such a way so as to ensure a possible influence on microwave radiation passing along the microwave channel 8 and going out of the oscillator 1 and to prevent, to a maximum degree possible, the reflected microwave from penetrating into the second channel 7. It would be however appreciated by those skilled in the art that it is possible to arrange the suppressing means 9 in the first channel 6, or partially in the first channel 6 and partially in the second channel 7, or partially outside the second channel 7.

As experiments have shown, there is an optimal ratio of cross sections of the microwave channel 8 and the suppressing means 9. Thus, the best results have been achieved when the minimum area of the cross section of the microwave channel 8 in the portion thereof where microwave radiation goes out, i.e. in the area of the outlet of the microwave channel 8, is approximately 8-12 times greater than the maximum area of the cross section of the suppressing means 9. Lower values of said ratio, i.e. when the suppressing means 9 occupies a greater area of the cross section of the microwave channel 8, cause a reduction in efficiency of the oscillator 1. Greater values of said ratio, i.e. when the suppressing means 9 occupies a lesser area of the cross section of the microwave channel 8, cause an increased penetration of the back microwave into the microwave channel 8, followed by increased heating and reduced efficiency of the oscillator 1.

Cooling channels 10 may be made in the resonator. The cooling channels 10 enable to monitor heating temperature of the oscillator 1, in order not to increase it to a critical value at which operation of the source 2 may be interrupted or may be undesirable. Those skilled in the art will understand that the cooling channels 10 may be made also in the box 3 only, or in the base only 4, or in the box 3 and in the base 4 (just this embodiment is shown in FIG. 2d).

In order to make the oscillator 1 functioning and achieving the above advantages over analogous solutions known in the art, it is necessary that the box 3 and the base 4 are electrically connected. Then currents arising in the resonator when microwave radiation passes from the source 2 will flow both over the base 4 and over the box 5 and, consequently, influence microwave radiation passing through the first channel 6 and the second channel 7. To connect the box 3 and the base 4 electrically, at least the surface of the microwave channel 8, i.e. the surfaces of the first channel 6 and the second channel 7, should be made electrically conductive. This may be done by various methods understandable for those skilled in the art, i.e. by making the box 3 and the base 4 of electrically conductive materials only; or by applying an electrically conductive layer 11 on the surface of the microwave channel 8, as shown in FIG. 2e (in this case a coating on the surface of the box 3 and that on the surface of the base 4 may be different in materials, thicknesses and other characteristics); or by installing additional electrically conductive shields onto or next to the surface of the microwave channel 8; or the like.

Figures 3A, 3B:
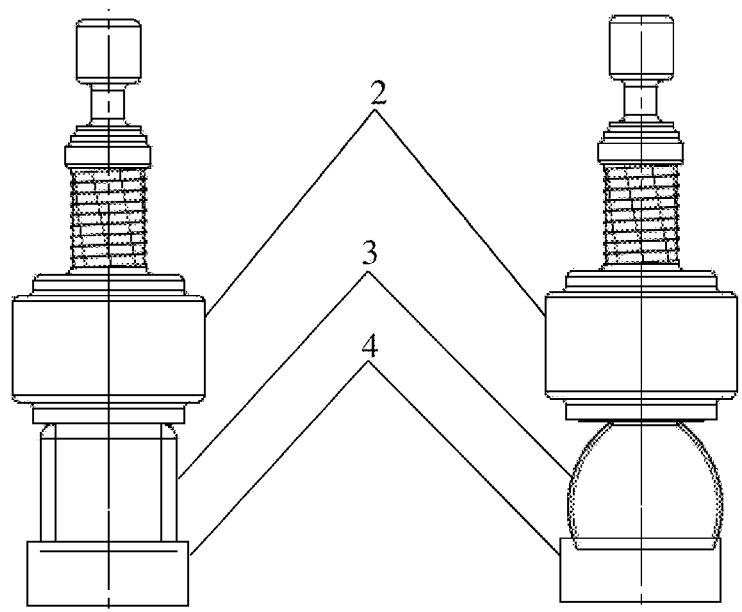
FIG. 3a shows an embodiment of the microwave oscillator with a box having a cylindrical shape.
FIG. 3b shows an embodiment of the microwave oscillator with a box having a spherical shape.

Shapes and designs of the box 3 and the base 4 may vary. As already discussed above, the base 4 may be made massive (solid), and the box 3 may be made hollow, but preferably the box 3 and the base 4 are both made massive. The shape of the box 3 may be rectangular or cylindrical (FIG. 3a), spherical (FIG. 3b), conical, etc.

If several oscillators 1 are combined so as their resonators are electrically connected to each other, this enables to form a matrix-type microwave oscillator discussed below in more detail.

For the sake of better understanding the essence of the invention, further a matrix-type oscillator of microwave radiation may be understood as two or more microwave oscillators 1 connected to each other. These two or more oscillators 1 may be connected in series, i.e. arranged one after another along a conventional line. This conventional line may be straight or curved. Examples of such the matrix-type oscillator are shown in FIGS. 4a-4d. Another possible variant of connecting several oscillators 1 may be matrices of oscillators 1, which are arranged on a conventional surface that may be plane or bent. Examples of such matrix-type oscillators are shown in FIGS. 8a-8i, 9. It is obvious that other variants of connecting two or more oscillators 1 are also possible, and some of them will be discussed below.

Figure 4A:
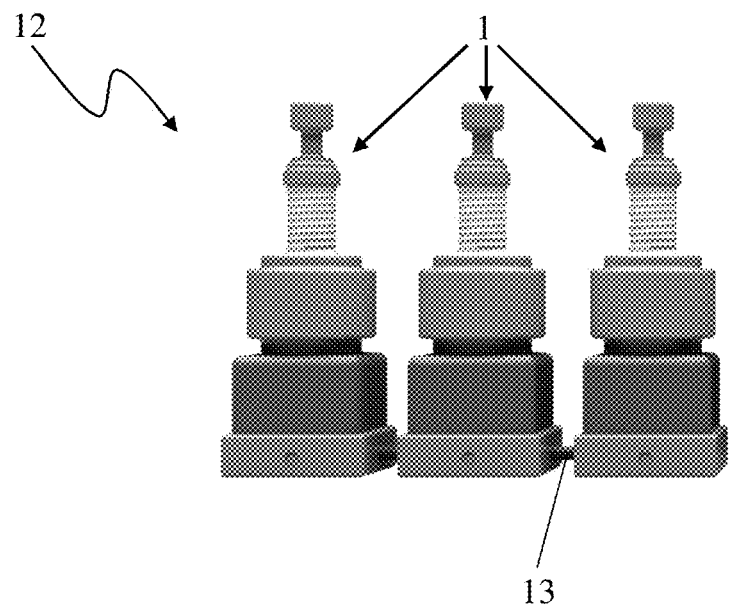
FIG. 4a shows a general view of an embodiment of the matrix-type microwave oscillator, wherein the microwave oscillators are arranged along a straight line.
Figure 4B:
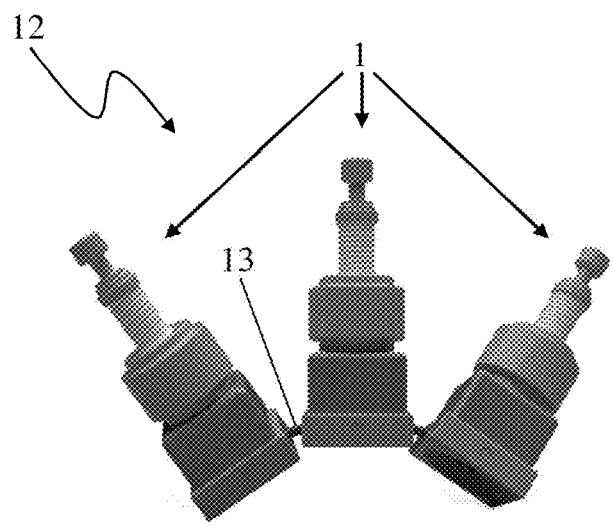
FIG. 4b shows a general view of yet another embodiment of the matrix-type microwave oscillator, wherein the microwave oscillators are arranged along a curved line.
Figure 4C:
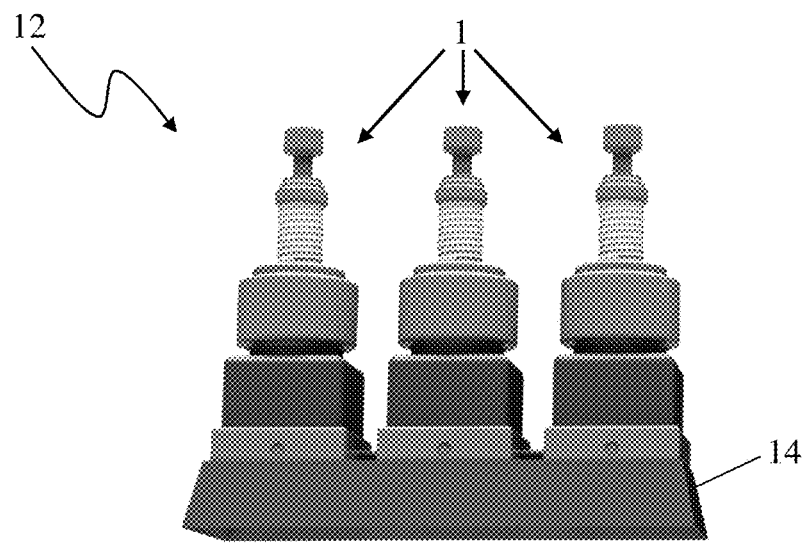
FIG. 4c shows a general view of still another embodiment of the matrix-type microwave oscillator with a common flare, wherein the microwave oscillators are arranged along a straight line.

FIGS. 4a-4d show embodiments of a matrix-type oscillator 12, wherein the matrix-type oscillator 12 may be made in the shape of a straight band shown in FIG. 4a, or as a bent band shown in 4b, or of any other shape.

Figure 7A:
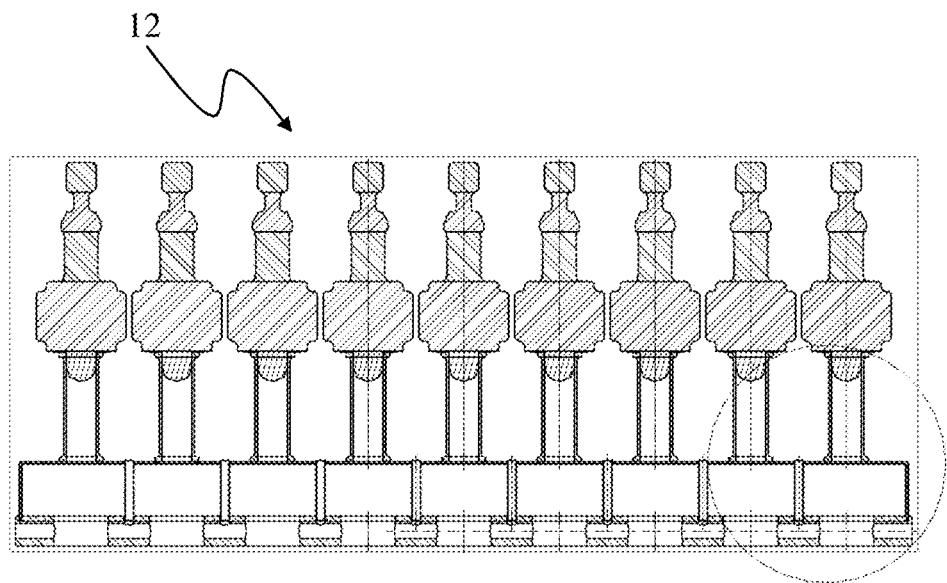
FIG. 7a shows a cross-sectional view of an embodiment of the matrix-type microwave oscillator.
Figure 7B:
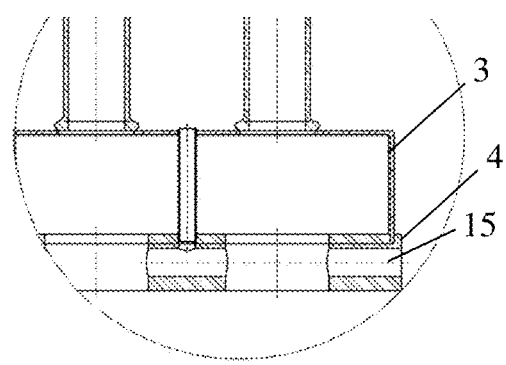
FIG. 7b shows an enlarged view of FIG. 7a, showing synchronizing channels.

Electric connection of the resonators of the oscillators 1 may be made, for example, by means of connectors 13 connecting, in particular, the neighboring oscillators 1 (FIGS. 4a, 4b), or by means of a common flare 14 (FIGS. 4c, 4d), or a common box and/or base (FIGS. 7a, 7b). Those skilled in the art will understand that other variants, apart from those shown in the Figures, of electrically connecting the neighboring oscillators 1 are also possible.

Figure 4D:
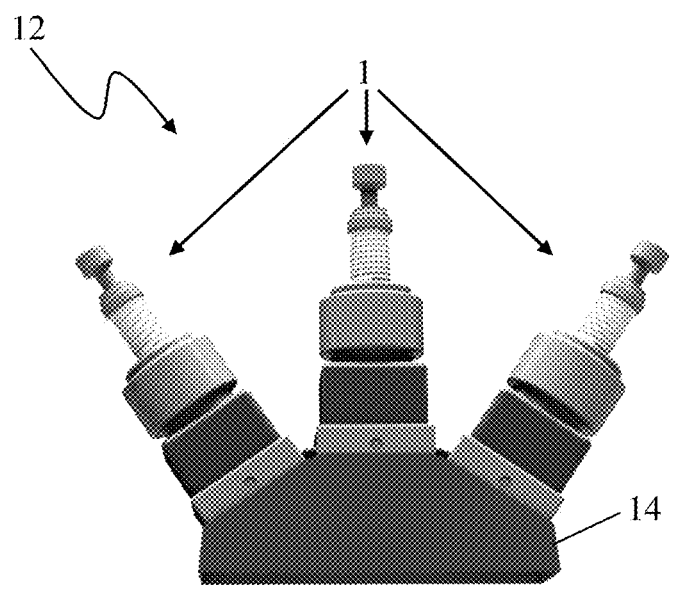
FIG. 4d shows a general view of yet another embodiment of the matrix-type microwave oscillator with a common flare, wherein the microwave oscillators are arranged along a curved line.

The oscillators 1 in the matrix-type oscillator 12 may have the common flare 14 which serves for forming a required spatial distribution of outgoing microwave radiation. Here, the oscillators 1 may be arranged either along one straight line (FIG. 4c) or at an angle to each other (FIG. 4d).

Figure 5A:
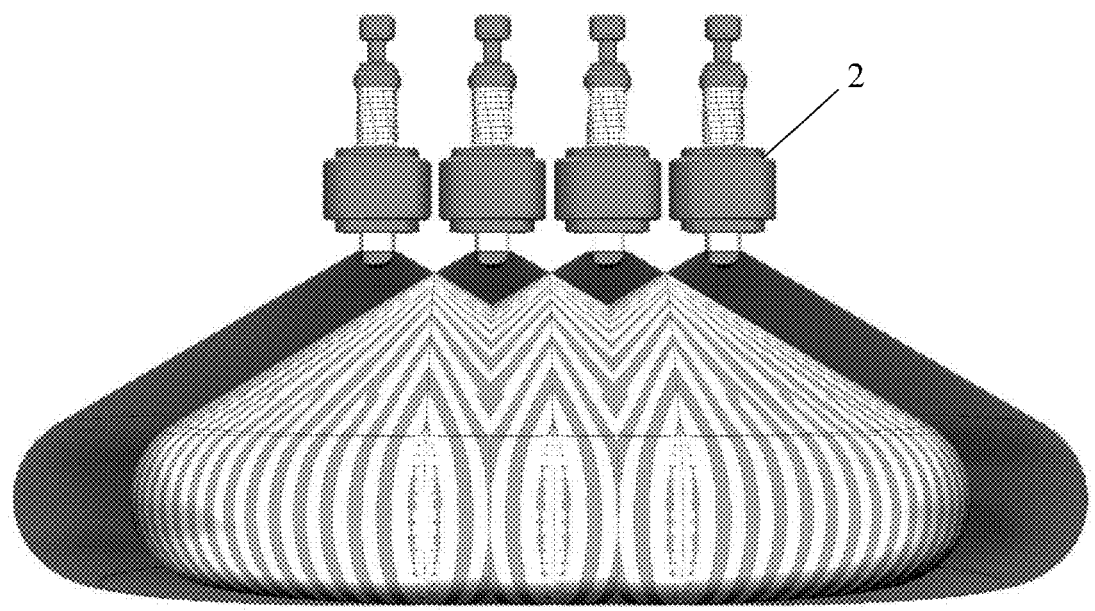
FIG. 5a schematically shows the distribution of a field of microwave radiation emitted by four independent microwave oscillators.

FIG. 5a schematically shows a distribution of a field of microwave radiation from four microwave sources (e.g., the sources 2) arranged next to each other. Darkened areas correspond to a high specific power of microwave radiation (i.e. microwave radiation power per unit area), and light areas correspond to a low specific power of microwave radiation. It is clearly seen that the total microwave radiation is highly inhomogeneous.

As the inventors revealed upon experiments, even the use of the resonator according to RU2394357 does not allow to sufficiently increasing homogeneity of the distribution of the total microwave radiation. Instead, the value of total output power of microwave radiation has significantly reduced, i.e. the known device is characterized by a low efficiency: according to Table 1 of RU2394357, the sum of powers provided by four magnetrons is 3036 W, whereas the output power of the summation device according to RU2394357 is just 2200 W, i.e. the efficiency thereof is approximately 72%.

Figure 5B:
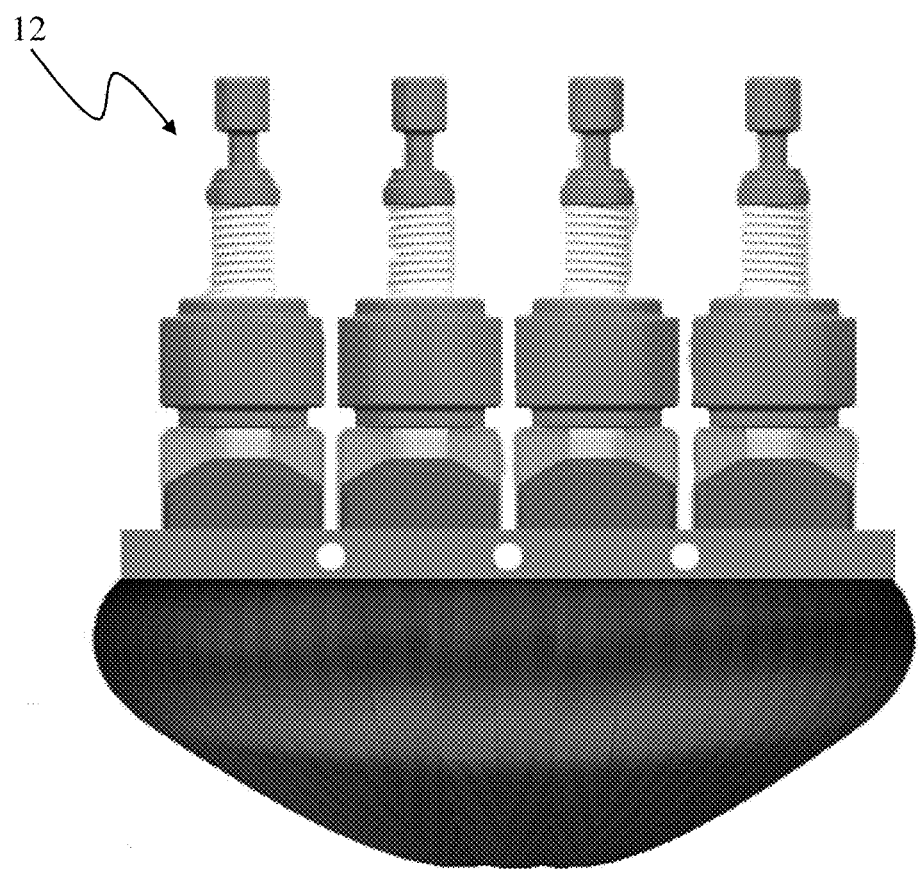
FIG. 5b schematically shows the distribution of a field of microwave radiation emitted by the matrix-type microwave oscillator according to the invention that comprises four microwave oscillators of the invention.

For the sake of comparison, FIG. 5b schematically shows the distribution of a field of microwave radiation emitted by the matrix-type microwave oscillator 12 according to this invention, wherein the number of the sources 2 used is equal to that in FIG. 5a. The field of total microwave radiation emitted by the matrix-type oscillator 12 is characterized by compactness and high spatial homogeneity of the power distribution, which is an important advantage of the invention over analogous solutions known in the art.

Figure 6A:
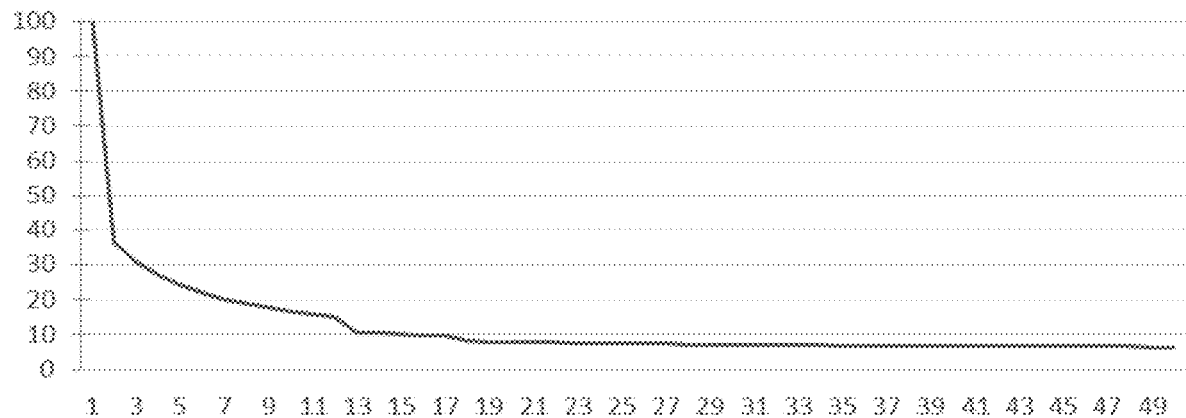
FIG. 6a shows the dependence of efficiency of a device comprising several independent microwave oscillators (similar to that shown in FIG. 5a) on a number of microwave sources.
Figure 6B:
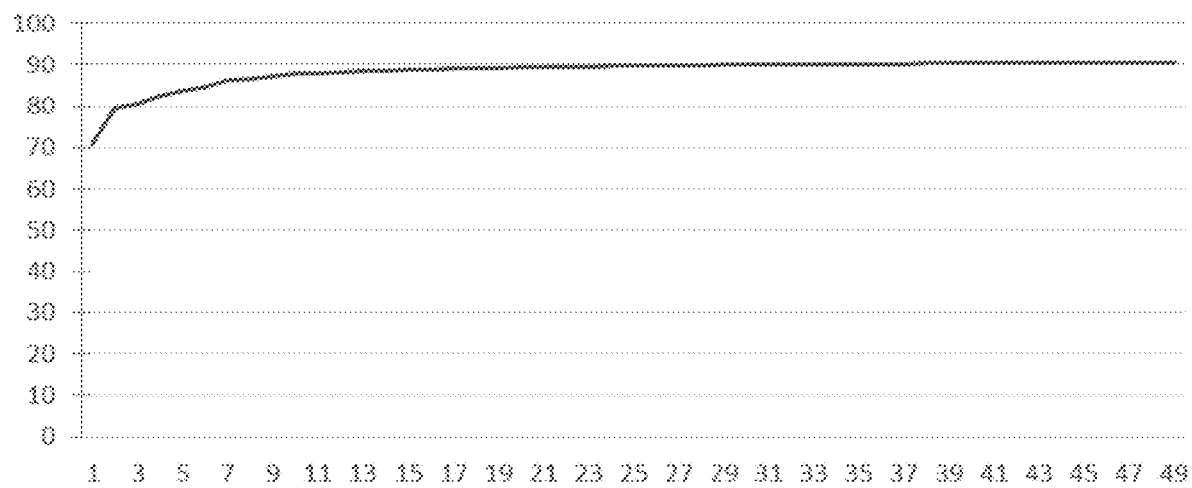
FIG. 6b shows the dependence of efficiency of the matrix-type microwave oscillator according to the invention (similar to that shown in FIG. 5b) on a number of microwave sources.

However, there is one more advantage of the invention over analogous solutions known in the art; it is shown in FIGS. 6a, 6b as curves. These Figures represent the dependence of efficiency of a device comprising several microwave sources (FIG. 6a) arranged close to each other (hereinafter referred to as "the known microwave device") and efficiency of the matrix-type microwave oscillator 12 according to the invention (FIG. 6b) on a number of the sources 2. In FIGS. 6a, 6b, the number of the sources 2 is plotted along the horizontal axis, and efficiency values are plotted along the vertical axis.

In known in the art devices, including the closest analog according to RU2394357, addition of one more source 2 results in a drop of the efficiency of the known microwave device (see FIG. 6a). Contrary to this, the efficiency of the matrix-type oscillator 12 according to the invention does not decrease, but even increases when adding the sources 2 (see FIG. 6b). Besides, the absolute efficiency value of the matrix-type oscillator 12 is higher than that of the known microwave device.

Thus, those skilled in the art will appreciate advantages of the matrix-type device 12 over the known microwave devices that comprise two or more microwave sources.

According to the inventors' opinion, said advantages are achieved due to the fact that, first, currents arising in each resonator of the matrix-type device 12 when microwave radiation passes from the sources 2 through the microwave channels 8 (i.e. the first channels 6 and the second channels 7) influence said microwave radiation. Taking into account that the resonators of the oscillators 1 are electrically connected to each other, said currents flow not only in "their own" resonators but also in the neighboring resonators, which results in synchronization of microwave radiation in all the microwave channels 8 of the matrix-type device 12.

Second, the achievement of these advantages is facilitated by the presence of the suppressing means 9 in the microwave channels 8, which, apart from direct suppression of a back microwave, also provides for equalization of the field of total microwave radiation and, possibly, synchronization of microwave radiations in all the microwave channels 8 of the matrix-type device 12.

Numerous experiments have shown that even higher efficiency and better homogeneity of the field of total microwave radiation may be achieved if the matrix-type oscillator 12 is provided with synchronizing channels 15 connecting the neighboring microwave channels 8, as shown in FIG. 7a and on an enlarged scale in FIG. 7b. In such a case a surface of the synchronizing channels 15 as well as the surface of the microwave channels 8 should be electrically conductive, which may be achieved by various methods, e.g. the methods described above in connection with ensuring electrical conductivity of the surfaces of the first channels 6 and the second channels 7. Alternatively or additionally to making the surfaces of the synchronizing channels 15 electrically conductive, the synchronizing channels 15 may be filled with a conductive liquid, metal, conductive powder, or with any other conductive substance.

The synchronizing channels 15 may be made either in the boxes 3 for connecting the first channels 6, or in the bases 4 for connecting the second channels 7, or in the boxes 3 and the bases 4 for connecting the first channels 6 and the second channels 7, or in the connectors 13.

In another possible embodiment, the synchronizing channels 15 may be implemented in the form of synchronizing inserts in the boxes 3 and/or the bases 4, as it is done in the resonator according to RU2394357.

Various embodiments of the boxes 3 and the bases 4 of the matrix-type oscillator 12 are possible. Thus, the boxes 3 of all or some oscillators 1 forming the matrix-type oscillator 12 may be an integral (single) part wherein the first channels 6 are made by drilling, milling, laser or plasma burning or by any other suitable method. Alternatively or additionally, the bases 4 of all or some oscillators 1 forming the matrix-type oscillator 12 may be an integral (single) part wherein the second channels 7 and, where applicable, the synchronizing channels 15 and/or the cooling channels 10 are made by drilling, milling, laser or plasma burning or by any other suitable method.

Making at least one of the boxes 3 and the bases 4 of the matrix-type oscillator 12 as an integral part enables to ensure a high degree of synchronization of microwave radiations due to more optimal distribution of currents induced in the boxes 3 and the bases 4 as well as good heat removal, which is an important advantage while using even a relatively small number of the oscillators 1 in the matrix-type oscillator 12.

Furthermore, the boxes 3 and the bases 4 may be, together, made as an integral (single) part, which, apart from the above said advantage, further increases produceability of the matrix-type oscillator 12.

As already said, the matrix-type microwave oscillator 12 according to this invention comprises two or more oscillators 1 electrically connected to each other. Said connection may be either serial, as shown in FIGS. 4a-4d, or of any type, as discussed below with reference to FIGS. 8, 9.

Figure 8A:
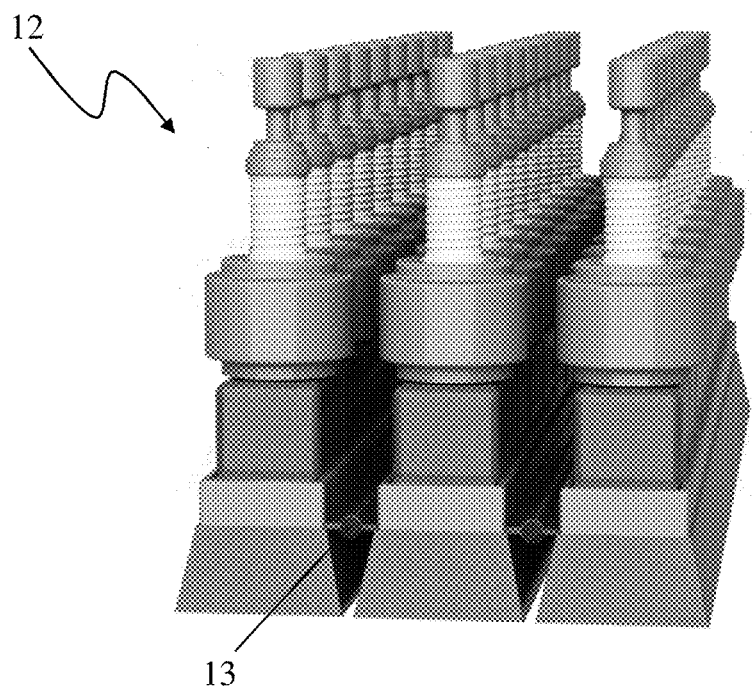
FIG. 8a shows a general view of yet another embodiment of the matrix-type microwave oscillator.
Figure 8B:
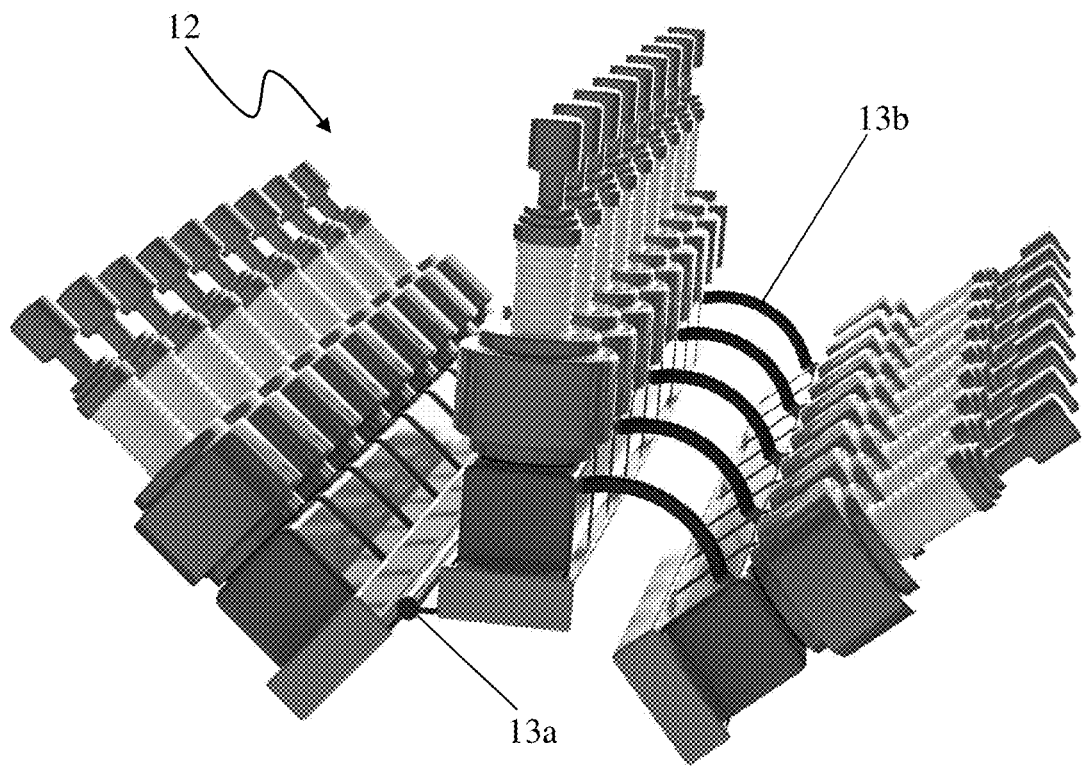
FIG. 8b shows a general view of still another embodiment of the matrix-type microwave oscillator.
Figure 8C:
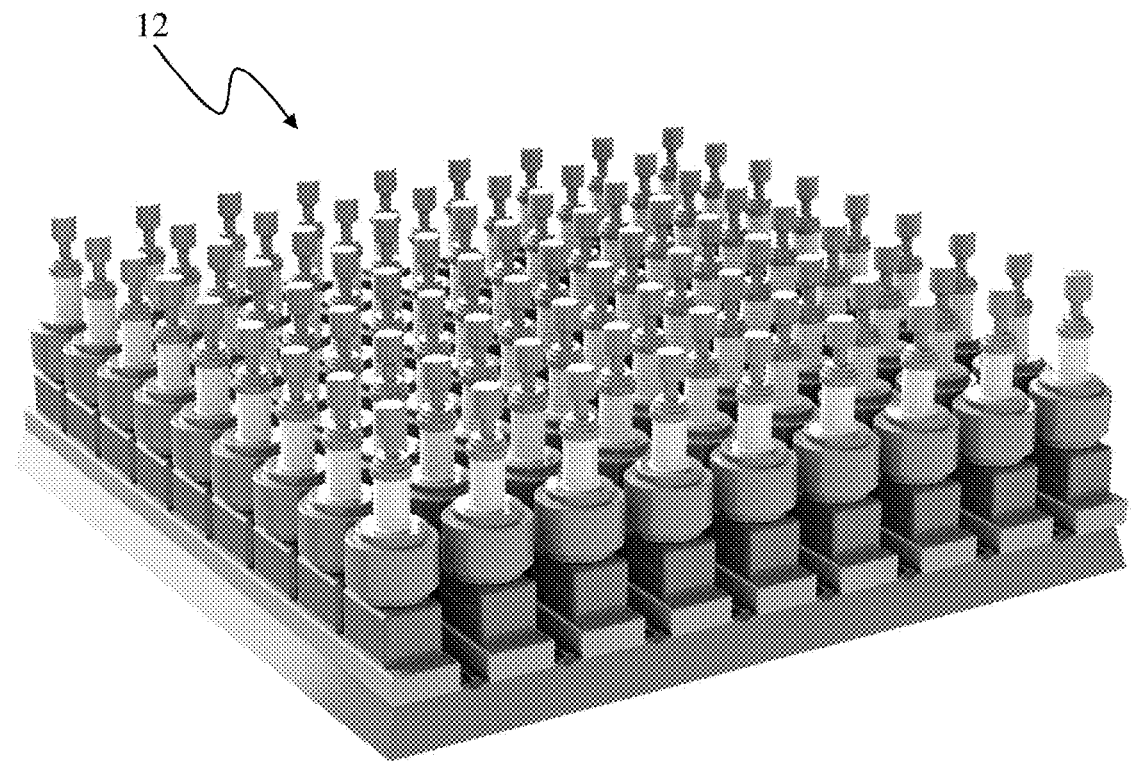
FIG. 8c shows a general view of yet another embodiment of the matrix-type microwave oscillator.
Figure 8D:
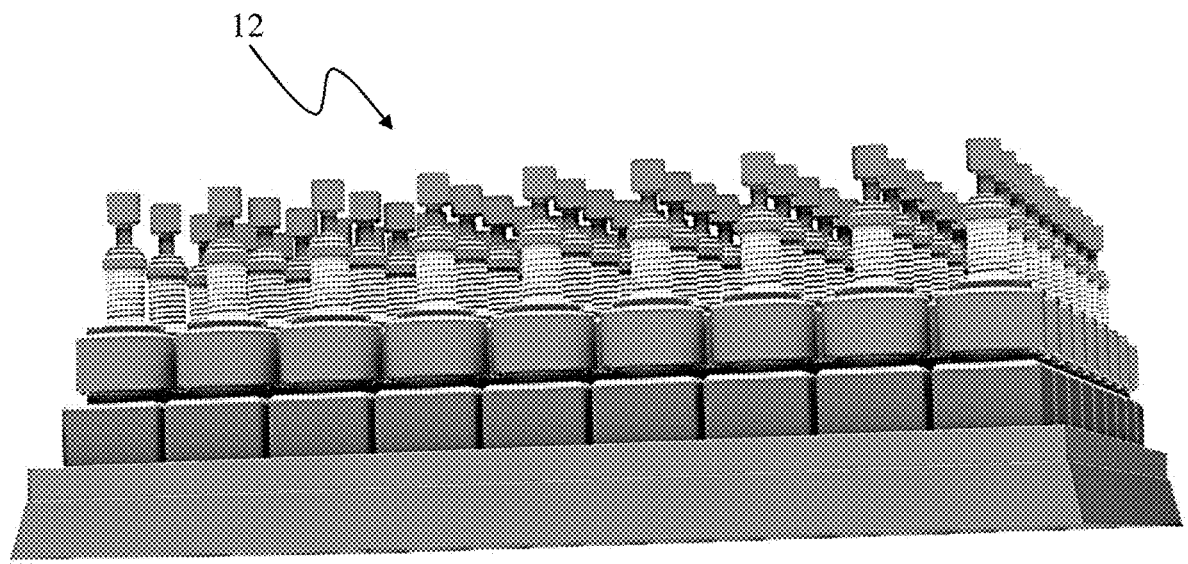
FIG. 8d shows a general view of still another embodiment of the matrix-type microwave oscillator.
Figure 8E:
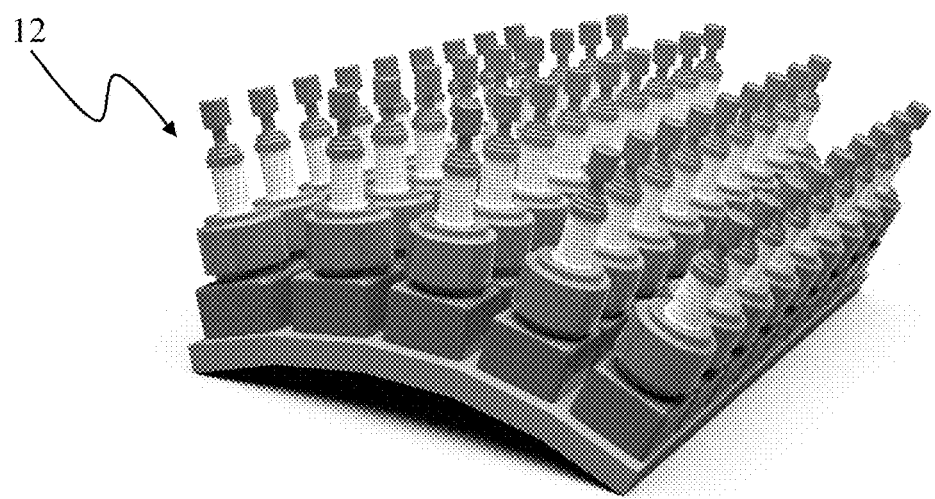
FIG. 8e shows a general view of yet another embodiment of the matrix-type microwave oscillator.
Figure 8F:
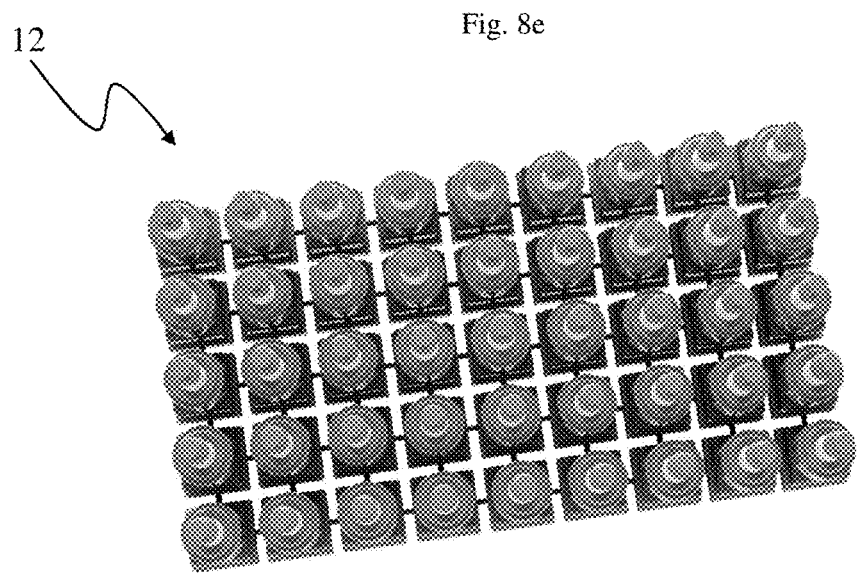
FIG. 8f shows a general view of still another embodiment of the matrix-type microwave oscillator.

Thus, FIGS. 8a-8i show some other embodiments of the matrix-type oscillator 12. Important is that all the oscillators 1 are electrically connected to each other, e.g. by means of the connectors 13 connecting the neighboring bases 4 (FIGS. 8a, 8f, 8h), or the neighboring boxes 3 (not shown in the Figures), or the connectors 13a, 13b connecting the neighboring bases 4 and the neighboring boxes 3, respectively (FIG. 8b).

Figure 8G:
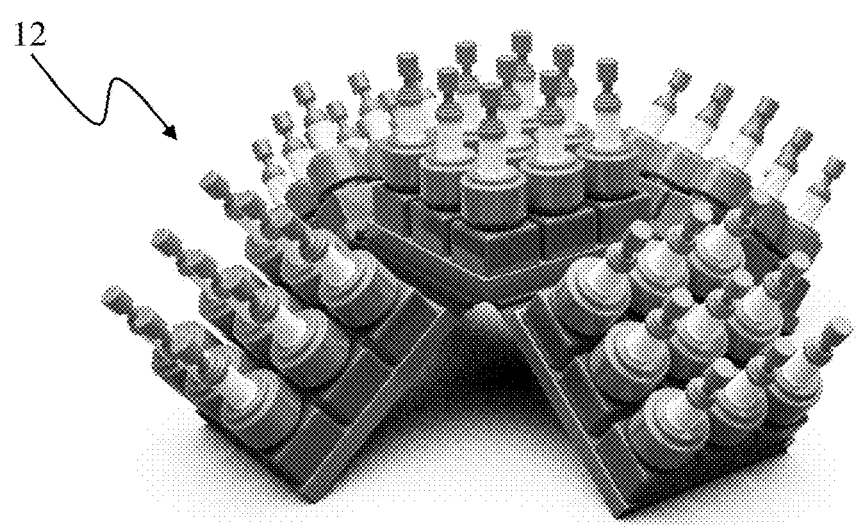
FIG. 8g shows a general view of yet another embodiment of the matrix-type microwave oscillator.
Figure 8H:
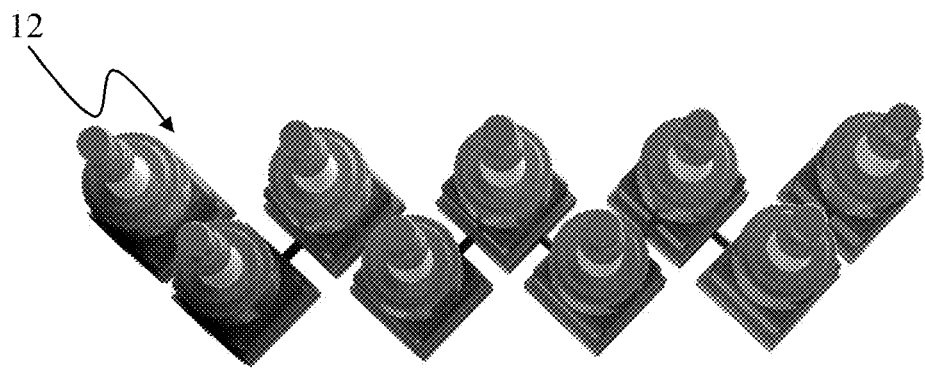
FIG. 8h shows a general view of still another embodiment of the matrix-type microwave oscillator.
Figure 8I:
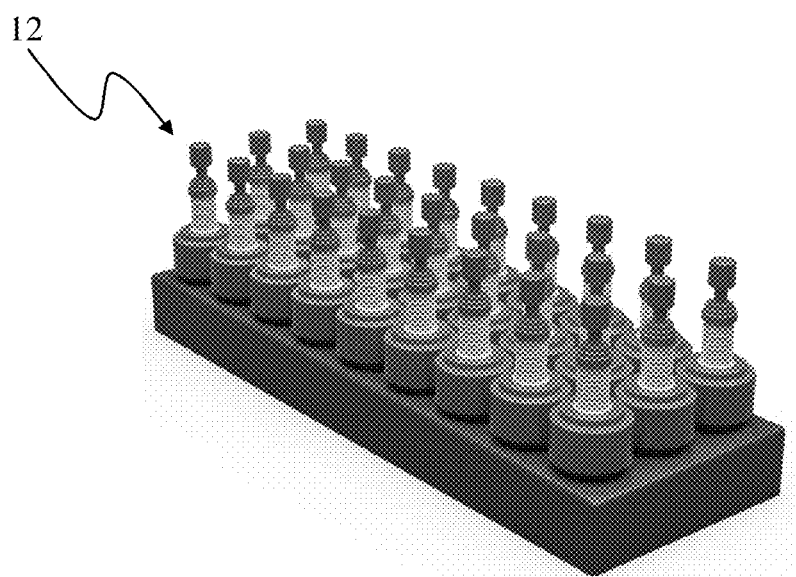
FIG. 8i shows a general view of yet another embodiment of the matrix-type microwave oscillator.
Figure 9:
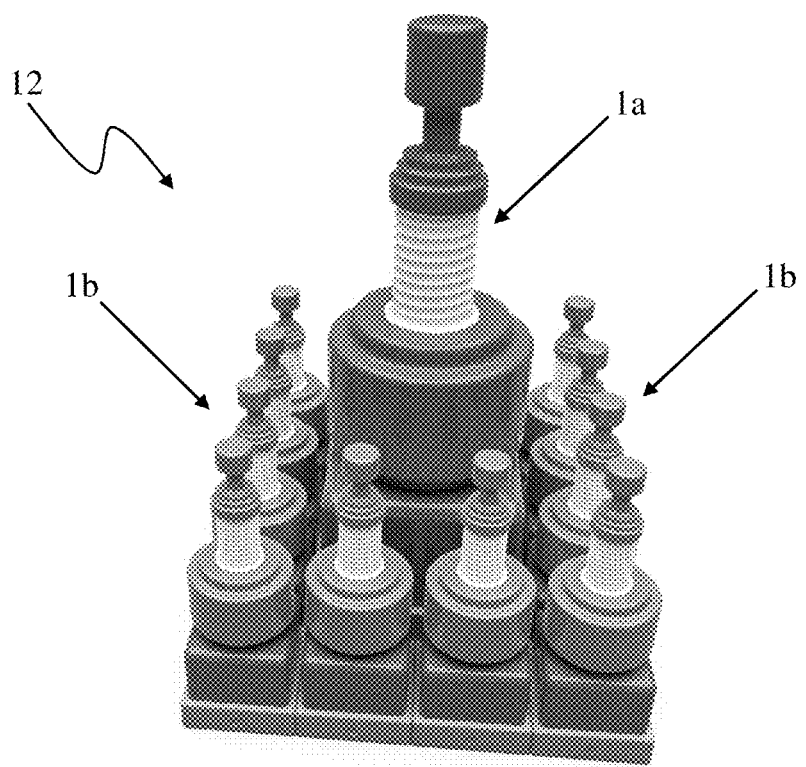
FIG. 9 shows a general view of still another embodiment of the matrix-type microwave oscillator with microwave sources having different power and different frequencies of microwave radiation.

Electric connection of the oscillators 1 may be also carried out by means of a common flare (waveguide) (FIG. 8c), or a common base (FIGS. 8d, 8e, 8i), or a common box (not shown in the Figures). Also, a combined variant is possible, wherein some oscillators 1 are electrically connected for example by means of the bases 4, and the other oscillators 1 are connected by means of the connectors 13, as shown in FIG. 8g. Those skilled in the art will understand that other variants of electric connections of the oscillators 1 are also possible.

It is to be noted that the connectors 13, 13a, 13b may be rigid, elastic, movable, flexible, which enables to shape the matrix-type oscillator 12 in such a way so as to form a required field of the total microwave radiation.

It is essential that the resonators of the oscillators 1 forming the matrix-type oscillator 12 are electrically connected to each other. This, as has been already said, ensures synchronization of microwave radiations in all the microwave channels 8 and, consequently, high homogeneity of the field of the total microwave radiation and high efficiency of the device.

A high degree of microwave radiation synchronization in the proposed matrix-type oscillator 12 enables not only to obtain a homogenous field of the total microwave radiation and high efficiency of the device, but also to use the sources 2 significantly differing in power and/or wavelength thereof. Thus, the inventors have managed to achieve stable operation of the matrix-type oscillator 12 schematically shown in FIG. 9, wherein one oscillator 1a with the operating frequency of 915 MHz and twelve oscillators 1b with the operating frequency close to 2400 MHz are used. Here, approximate efficiency of 80% was achieved. However, the best efficiency values for the matrix-type oscillator 12 may be achieved when a spread of the operating frequencies of the oscillators 1 does not exceed 25%. And the efficiency increase is inversely proportional to said spread of the operating frequencies.

Furthermore, as experiments have shown, the best results in synchronizing radiation of a plurality of the oscillators 1 and increasing efficiency of the matrix-type oscillator 12 may be achieved if the surfaces of the microwave channels 8 are smooth enough. The lower the surface roughness is, the lesser the microwave radiation passing through the microwave channels 8 scatters from the surfaces of the microwave channels 8 and absorbs by said surfaces. In particular, the best results have been achieved when the parameter Rz relating to roughness of the surfaces of the microwave channels 8 is not more than 2 microns, while the efficiency increase is inversely proportional to the roughness value.

Thus, the proposed variants of the microwave radiation devices, namely the microwave oscillator 1 and the matrix-type microwave oscillator 12, enable to efficiently direct microwave radiation emitted by one or more microwave sources 2 and sum up said microwave radiations, ensuring high efficiency and total output power, providing for extended functional capabilities of the devices, and a high degree of synchronization of microwave radiations emitted by the microwave sources 2.

What is claimed is:

1. A microwave oscillator, comprising:
a microwave source, and
a resonator having a microwave channel for guiding radiation from said microwave source, said resonator comprising:
   a box having a first channel, said microwave source being installed on said box; and
   a base having a second channel, said base being electrically connected to said box,
wherein the second channel being an extension of the first channel, and said first channel and said second channel forming a microwave channel having an outlet through which microwave radiation is emitted,
wherein said microwave channel accommodating, at least partially, a suppressing means for suppressing a back wave, and
wherein a minimum cross section area of the microwave channel at the outlet is 8 to 12 times greater than a maximum cross section area of the suppressing means.

2. The oscillator of claim 1, further comprising a waveguide connecting the microwave source and the box.

3. The oscillator of claim 1, wherein the resonator is made as a single part.

4. The oscillator of claim 1, wherein the microwave channel has a variable cross section.

5. The oscillator of claim 4, wherein the second channel expands in a direction from the first channel to the outlet of the microwave channel.

6. The oscillator of claim 1, wherein a surface of the microwave channel is coated with a layer of an electrically conductive material.

7. The oscillator of claim 1, further comprising at least one cooling channel made in the resonator.

8. A matrix-type microwave oscillator, comprising:
at least two microwave oscillators according to claim 1, wherein the resonators of said at least two microwave oscillators are electrically connected to each other.

9. The matrix-type oscillator of claim 8, further comprising flares arranged on the bases of said at least two microwave oscillators.

10. The matrix-type oscillator of claim 9, wherein all the flares of said at least two microwave oscillators are made as a single part.

11. The matrix-type oscillator of claim 8, wherein all the bases of said at least two microwave oscillators are made as a single part.

12. The matrix-type oscillator of claim 8, further comprising synchronizing channels connecting the microwave channels of said at least two microwave oscillators.

13. The matrix-type oscillator of claim 8, further comprising synchronizing inserts arranged in the boxes and/or the bases of said at least two microwave oscillators.

14. The matrix-type oscillator of claim 8, wherein at least some of said at least two microwave oscillators are electrically connected to each other by means of connectors.

* * * * *